(12) United States Patent
Nishimura et al.

(10) Patent No.: US 8,228,707 B2
(45) Date of Patent: Jul. 24, 2012

(54) SEMICONDUCTOR MEMORY DEVICE

(75) Inventors: Hisaaki Nishimura, Yokohama (JP); Katsuhiko Hoya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 377 days.

(21) Appl. No.: 12/566,398

(22) Filed: Sep. 24, 2009

(65) Prior Publication Data

US 2010/0128513 A1 May 27, 2010

(30) Foreign Application Priority Data

Nov. 21, 2008 (JP) .................................. 2008-297838

(51) Int. Cl.
*G11C 11/22* (2006.01)

(52) U.S. Cl. .................... 365/145; 365/149; 365/189.14; 365/189.11; 365/203; 365/207; 365/208; 365/189.09

(58) Field of Classification Search .................. 365/154, 365/149, 189.14, 189.11, 203, 207, 208, 365/189.09, 14, 189.095
See application file for complete search history.

(56) References Cited

U.S. PATENT DOCUMENTS

| | | | |
|---|---|---|---|
| 6,487,104 B2 | 11/2002 | Takashima | |
| 6,510,071 B2 | 1/2003 | Oowaki | |
| 6,657,883 B2 | 12/2003 | Takashima | |
| 2004/0174750 A1* | 9/2004 | Eliason et al. | 365/189.09 |
| 2008/0084730 A1* | 4/2008 | Hoya et al. | 365/145 |
| 2008/0205117 A1* | 8/2008 | Takashima | 365/145 |
| 2009/0103349 A1* | 4/2009 | Hoya | 365/145 |

FOREIGN PATENT DOCUMENTS

| | | |
|---|---|---|
| JP | 2001-250376 | 9/2001 |
| JP | 2001-319472 | 11/2001 |

* cited by examiner

*Primary Examiner* — Fernando Hidalgo
(74) *Attorney, Agent, or Firm* — Knobbe, Martens, Olson & Bear, LLP

(57) ABSTRACT

A memory cell array includes a memory cell comprising a ferroelectric capacitor and a transistor arranged therein. A plate line applies a drive voltage to one end of the ferroelectric capacitor. A bit line reads data stored in the memory cell from the other end of the ferroelectric capacitor. A sense amplifier circuit detects and amplifies a signal read to the bit line from the ferroelectric capacitor. A bit line voltage control circuit performs control of changing a voltage of the bit line to which the signal is read, thereby pulling up a potential difference between the plate line and the bit line, prior to operation of the sense amplifier circuit for data read. The bit line voltage control circuit varies a range of variation of the voltage of the bit line depending on ambient temperature.

17 Claims, 17 Drawing Sheets

[LOW TEMPERATURE]

[NORMAL TEMPERATURE]

[HIGH TEMPERATURE]

[LOW TEMPERATURE]

[NORMAL TEMPERATURE]

[HIGH TEMPERATURE]

SEMICONDUCTOR MEMORY DEVICE

CROSS REFERENCE TO RELATED APPLICATIONS

This application is based on and claims the benefit of priority from prior Japanese Patent Application No. 2008-297838, filed on Nov. 21, 2008, the entire contents of which are incorporated herein by reference.

BACKGROUND OF THE INVENTION

1. Field of the Invention

The present invention relates to a semiconductor memory device. More specifically, it relates to a ferroelectric memory that stores data in a non-volatile manner using a memory cell including a ferroelectric capacitor and a transistor.

2. Description of the Related Art

A ferroelectric memory (FeRAM) is a semiconductor memory device using hysteresis properties of a ferroelectric capacitor. FeRAM can store data in a nonvolatile manner based on two different polarization strengths of a ferroelectric material. In general, a memory cell in a conventional ferroelectric memory adopts a similar architecture to DRAM. That is, a paraelectric capacitor in DRAM is replaced with a ferroelectric capacitor, and the ferroelectric capacitor and a transistor are connected in series to form a memory cell (JP2001-250376A). A plurality of such ferroelectric capacitors and transistors are arranged to form a memory cell array. The ferroelectric memory includes a 2 transistor-2 cell scheme (2T/2C scheme) in which data is read from two memory cells, and a 1 transistor-1 cell scheme (1T/1C scheme) in which data is read from one memory cell.

The 1T/1C system selects a word line of the cell to be read, and turns on the select transistor, thereby connecting the memory cell to a bit line. A plate voltage is then applied to a plate line connected to the memory cell, and a voltage is applied across the ferroelectric capacitor included in the memory cell. The charge from the ferroelectric capacitor is read to the bit line. The bit line forms a bit-line pair with another bit line (complementary bit line). The complementary bit line is applied with a reference potential from a reference potential generating circuit. A sense amplifier amplifies the difference between the bit-line pair potentials. The difference in the charge read to the bit-line pair thus represents an amount of signal.

The 1T/1C scheme is advantageous for high integration, but because the amount of signal is half that of the 2T/2C scheme, increasing the amount of signal is a problem. Known as a way of increasing the amount of signal in the 1T/1C scheme is, for example, a technique as disclosed in JP2001-319472A.

In the technique of this JP2001-319472A, after the voltage is applied across the ferroelectric capacitor and the signal corresponding to data is read to the bit line, and prior to operation of a sense amplifier circuit, control is performed to reduce (step down) the voltage of the bit line to which the signal is read. The step down operation causes an absolute value of the amount of the signal to decrease in both data "1" and data "0". However, as a result of the latter decrement being larger than that of the former, the difference in the amount of signal can be increased. The technique of this JP2001-319472A has some effectiveness as a way of increasing the difference in the amount of signal.

SUMMARY OF THE INVENTION

In accordance with an aspect of the present invention, a semiconductor memory device includes: a memory cell array including a memory cell comprising a ferroelectric capacitor and a transistor arranged therein; a word line configured to select the memory cell; a plate line configured to apply a drive voltage to one end of the ferroelectric capacitor; a bit line configured to read data stored in the memory cell from the other end of the ferroelectric capacitor; a sense amplifier circuit configured to detect and amplify a signal read to the bit line from the ferroelectric capacitor; and a bit line voltage control circuit configured to perform control of changing a voltage of the bit line to which the signal is read, thereby pulling up a potential difference between the plate line and the bit line, prior to operation of the sense amplifier circuit for data read, the bit line voltage control circuit being configured to vary a range of variation of the voltage of the bit line depending on ambient temperature.

DETAILED DESCRIPTION OF THE EMBODIMENTS

Embodiments of the present invention will now be described in detail with reference to the drawings.

[Basic Concept]

Before explanation of specific embodiments, a basic concept of the present invention is described.

Figure 1:
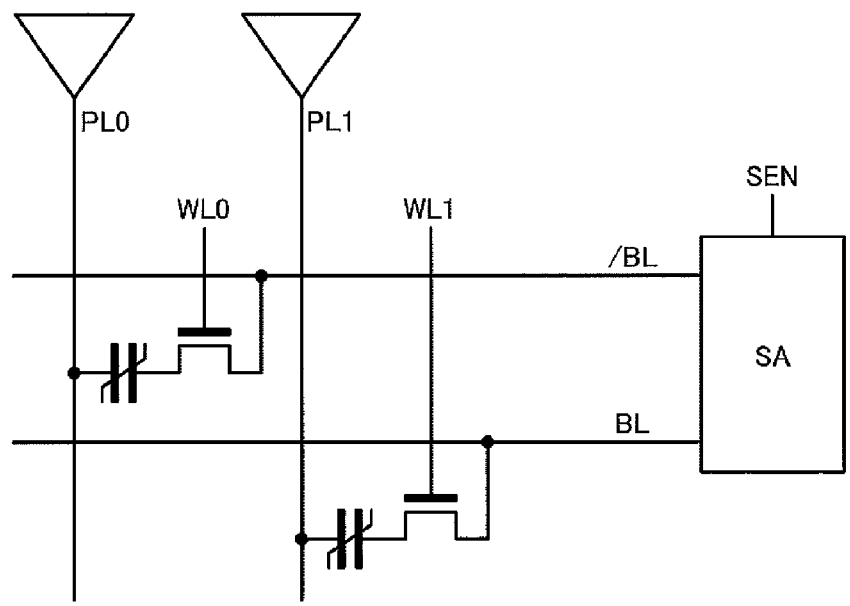
FIG. 1 is a simple circuit diagram showing an example of a circuit of a common ferroelectric memory.

First, an example of a circuit of a common ferroelectric memory is simply described with reference to FIGS. 1 and 2. A memory cell in the ferroelectric memory shown in this FIG. 1 is configured to connect one NMOS transistor and one ferroelectric capacitor in series, similarly to DRAM. This memory cell structure is referred to as a 1T/1C structure. It is also possible for one memory cell to be comprised by a pair of memory cells connected to each of bit lines of a bit-line pair, and this structure is referred to as a 2T/2C structure.

Figure 2:
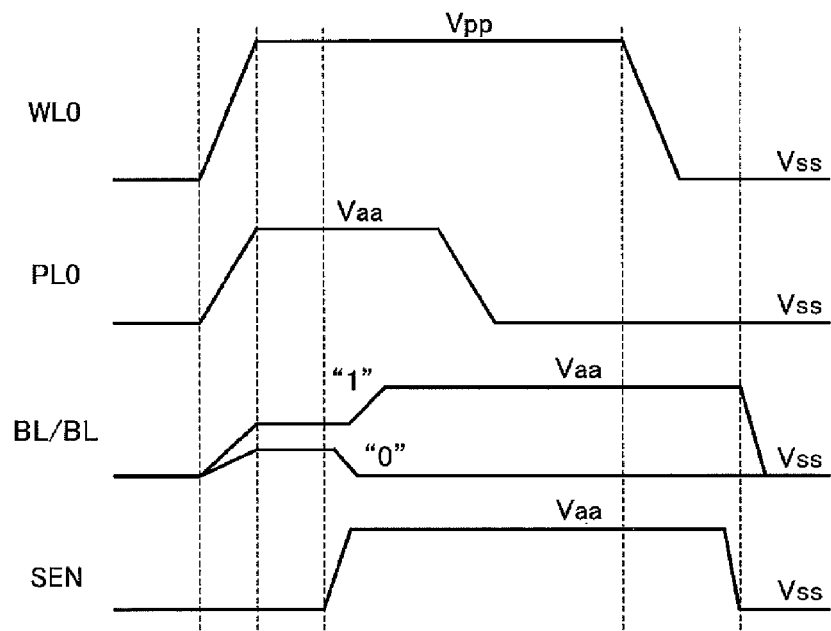
FIG. 2 is an operation wave pattern chart showing an operation of the ferroelectric memory of FIG. 1.

FIG. 2 shows an operation wave pattern of the ferroelectric memory shown in FIG. 1. During standby, bit lines BL and /BL are pre-charged to a ground potential Vss, and plate lines PL0 and PL1 are also set to the ground potential Vss. During active state, the bit lines BL and /BL are first set to a floating state, a selected word line WL is applied with a voltage Vpp, and a selected plate line PL0 is raised from the ground potential Vss to an array voltage Vaa. Here, the array voltage Vaa is an internal common power supply used commonly within a memory cell array, and is normally an external power supply voltage Vdd or a stepped-down voltage thereof.

At this time, a voltage is applied to the ferroelectric capacitor of the selected cell with a bit line capacitance Cb as a load capacitance, and a signal charge is read to the bit line. A potential read to the bit line differs between cell data "1" and "0". When data is "1", polarization inversion occurs to produce a large potential in the bit line; when data is "0", there is no occurrence of polarization inversion, and the bit line shows a small potential change.

In the case of the 1T/1C structure, a reference potential is set midway between a bit line potential of "0" and "1" data, and a sense is performed of data with a sense amplifier. That is, after data read to the bit line, "1" data and "0" data are amplified to the array voltage Vaa and the ground voltage Vss, respectively, by setting a sense amplifier activation signal SEN to "H".

"1"-data read is a destructive read causing polarization inversion. In a cell of "1" data, after a read data sense, the bit line is at a voltage of Vaa, and a voltage across the ferroelectric capacitor is approximately 0. Thereafter, the plate line is returned to Vss. This allows a reversed-polarity voltage Vaa that is opposite to the voltage during read is applied to the ferroelectric capacitor, and the destructed data "1" is written again.

On the other hand, in a cell of "0" data, because the bit line is Vss, the voltage Vaa is applied to the ferroelectric capacitor from the plate line side. When the plate line is returned to Vss, the voltage across the ferroelectric capacitor becomes zero, and it returns to an original residual polarization state. That is, the destructive read does not occur. Then, the word line WL0 is lowered, and the bit lines BL and /BL are returned to the voltage Vss, thereby returning to standby.

Figure 3:
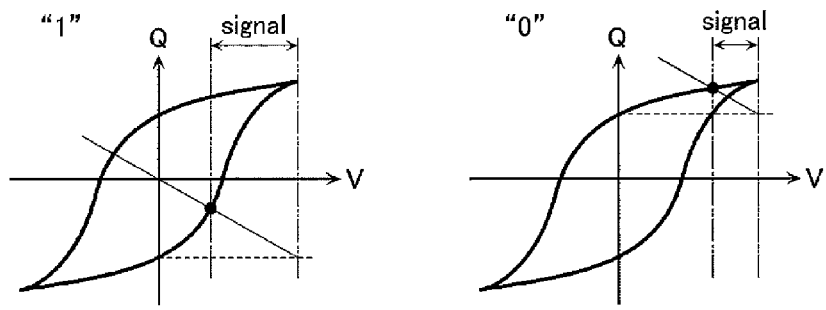
FIG. 3 shows a voltage application curve (at a time of low temperature) of a ferroelectric capacitor included in a memory cell, when a read operation of the ferroelectric memory is performed.
Figure 4:
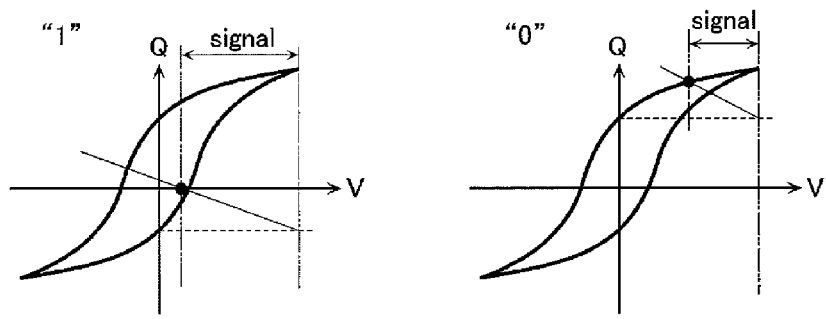
FIG. 4 shows a voltage application curve (at a time of normal temperature) of a ferroelectric capacitor included in a memory cell, when a read operation of the ferroelectric memory is performed.
Figure 5:
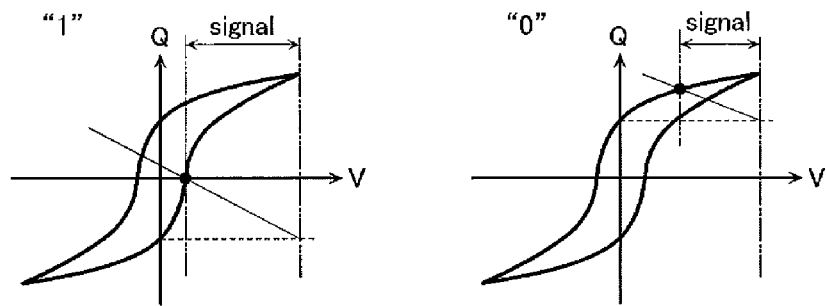
FIG. 5 shows a voltage application curve (at a time of high temperature) of a ferroelectric capacitor included in a memory cell, when a read operation of the ferroelectric memory is performed.

FIGS. 3-5 show a voltage application curve of a ferroelectric capacitor included in a memory cell, when a read operation of the ferroelectric memory is performed, at times of low temperature, normal temperature and high temperature ambient temperature, respectively. The horizontal axis of FIGS. 3-5 shows a magnitude of a voltage applied to the ferroelectric capacitor. The voltage is expressed as a positive value when a voltage of a plate line side terminal is higher than that of a bit line side terminal, whereas expressed as a negative value when a voltage of a bit line side terminal is higher than that of the plate line side terminal. FIGS. 3-5 each illustrates a load straight line of bit line capacitance Cb on the hysteresis curve of the ferroelectric capacitor. A read voltage to the bit line is obtained as a voltage at an intersection of the hysteresis curve and the load straight line for each of "0" and "1" data.

Figure 6:
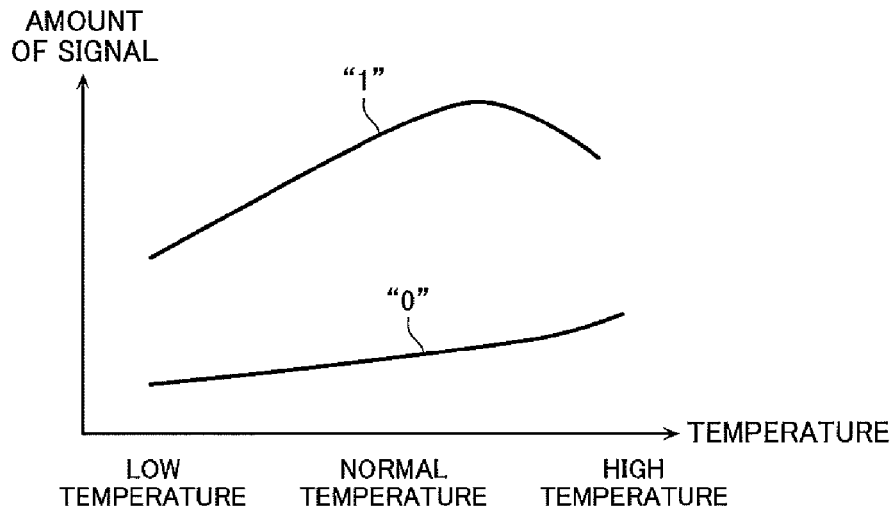
FIG. 6 shows a variation in an amount of signal in accordance with variation in ambient temperature for each of "0" data and "1" data.

FIG. 6 shows a variation in an amount of signal with ambient temperature for each of "0" data and "1" data. As is apparent from FIG. 6, the amount of signal changes with temperature in both the case where the memory cell holds "0" data and the case where it holds "1" data.

Thus, in the present invention, a voltage is applied between both ends of the ferroelectric capacitor to transmit a signal corresponding to the stored data to the bit line. Then, prior to operation of the sense amplifier circuit, a voltage of the bit line where the signal is read is pulled down. In this case, the amount of the pull-down is varied in accordance with the ambient temperature. Specific embodiments are described below.

First Embodiment

Figure 7:
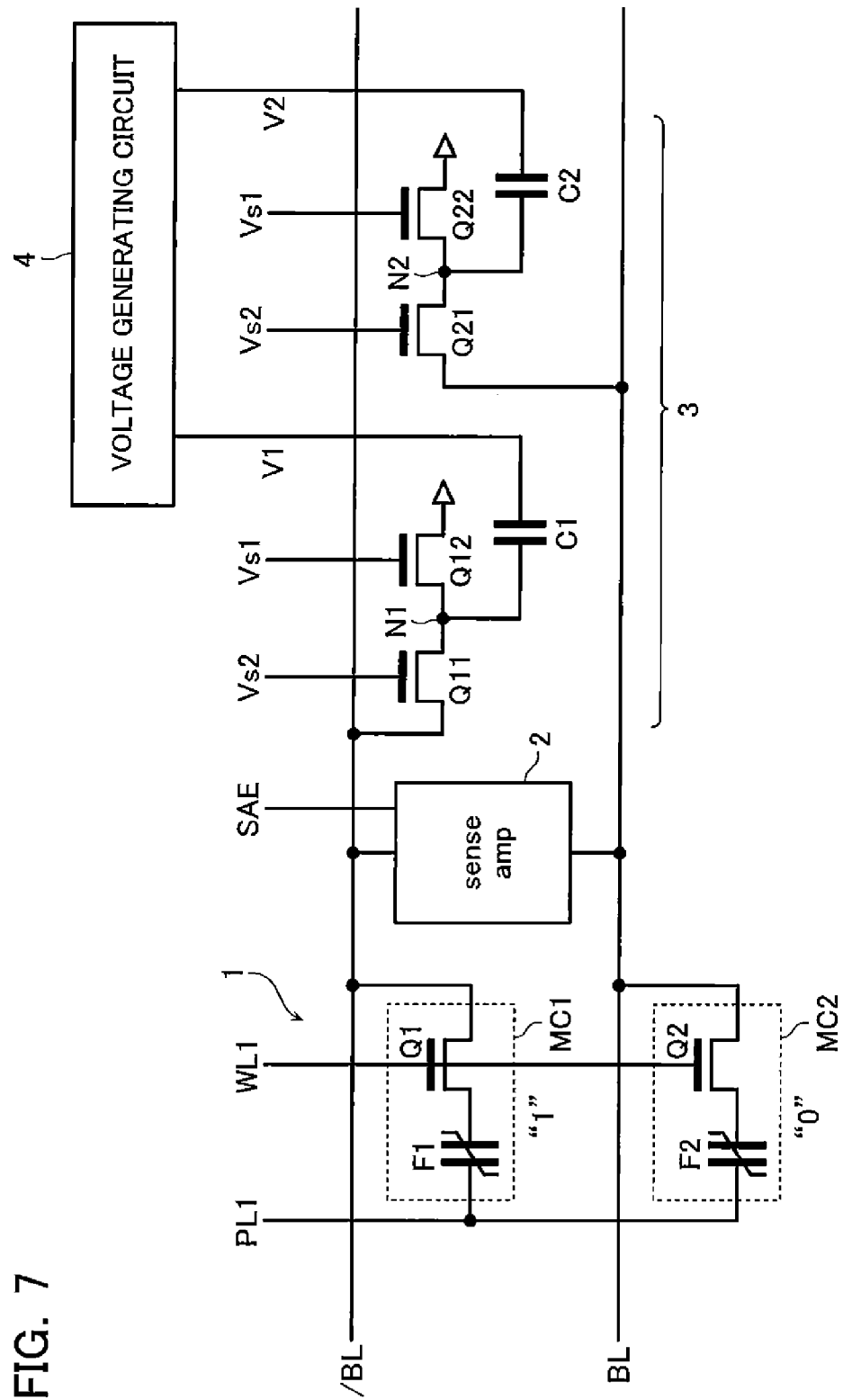
FIG. 7 shows a circuit configuration of a ferroelectric memory in accordance with a first embodiment of the present invention.

Next, a ferroelectric memory in accordance with a first embodiment of the present invention is described. FIG. 7 shows a circuit configuration of the ferroelectric memory in accordance with the first embodiment of the present invention.

A memory cell array 1 of this embodiment employs the 2T/2C structure. One data is stored by two memory cells MC1 and MC2 connected to bit lines BL and /BL comprising a bit-line pair, respectively. For example, when "1" data is stored in the memory cell MC1, "0" data which is the complementary data thereto is stored in the memory cell MC2. A memory cell MC is configured having a ferroelectric capacitor F and an NMOS transistor Q connected in series.

One end of ferroelectric capacitors F1 and F2 is connected to a plate line PL1, and the other end is connected to the bit lines /BL and BL via NMOS transistors Q1 and Q2, respectively. The NMOS transistors Q1 and Q2 have a gate thereof connected to a common word line WL1 and are turned on simultaneously. The bit-line pair BL and /BL is connected to a sense amplifier circuit 2. In addition, the bit-line pair BL and /BL is provided with a bit line voltage control circuit 3 to control the bit line voltage during data read.

The bit line voltage control circuit 3 has capacitors C1 and C2 for coupling, and NMOS transistors Q11 and Q21. The capacitors C1 and C2 are coupled to selected bit lines during read, and pull down a potential of the selected bit lines. The NMOS transistors Q11 and Q21 selectively connect one ends N1 and N2 of the capacitors C1 and C2, respectively, to the bit line pair /BL and BL. Other ends of the capacitors C1 and C2 are connected to a voltage generating circuit 4, and are applied with a certain voltage from control signal lines V1 and V2. A voltage of these control signal lines V1 and V2 is given a certain temperature characteristic. The NMOS transistors Q11 and Q21 are controlled by a control signal line Vs2.

Nodes N1 and N2 of the capacitors C1 and C2 are further provided with reset NMOS transistors Q12 and Q22 to reset a potential of the nodes N1 and N2 to the ground potential Vss. The reset NMOS transistors Q12 and Q22 are controlled by a control signal line Vs1. Note that the control signal lines Vs1 and Vs2 have a voltage controlled by a row decoder circuit not shown, for example.

Figure 8:
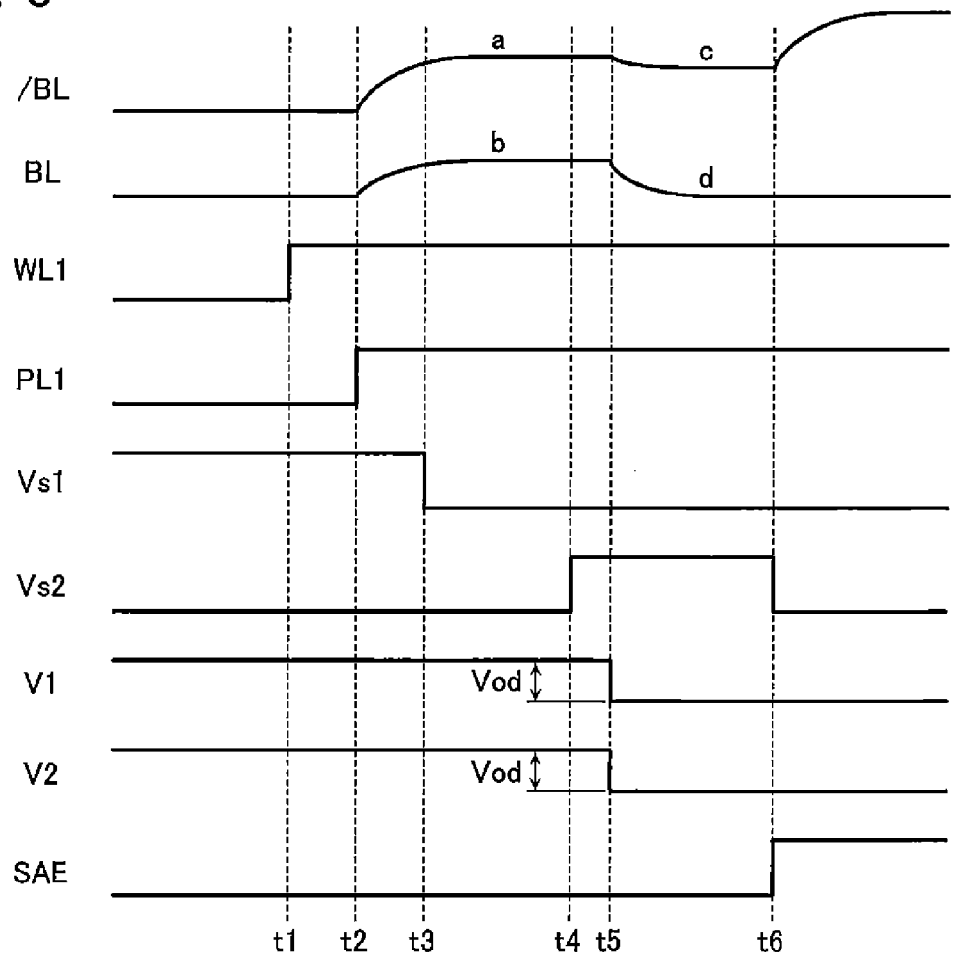
FIG. 8 shows an operation wave pattern of the ferroelectric memory in the first embodiment.

FIG. 8 shows an operation wave pattern of the ferroelectric memory in this embodiment.

This operation wave pattern is for the case where a word line WL1 and the plate line PL1 connected to the memory cell MC1 and the memory cell MC2 are selected to execute a data read and re-write. Note that, here, an example is shown when the bit line /BL is set to "H". When the bit line BL is set to "H", the same operation is performed.

During standby, the bit-line pair /BL and BL, the word line WL1 and the plate line PL1 are all set to the ground potential Vss. In addition, voltages of the control signal lines V1 and V2 are both set to "H" (=Vaa). Moreover, a voltage of the control signal line Vs1 is set to "H", and a voltage of the control signal line Vs2 is set to "L" (=Vss). The capacitors C1 and C2 are thereby charged with a charge of Vaa·C.

Next, at time t1, the word line WL1 is set to "H" and then, at time t2, the plate line PL1 is set to "H". The voltage (a, b) depending on the stored data of the memory cells MC1 and MC2 thereby appears in the bit-line pair /BL and BL.

Subsequently, at time t3, the voltage of the control signal line Vs1 is lowered from "H" to "L", and, following this, at time t4, the voltage of the control signal line Vs2 is raised from "L" to "H". The nodes N1 and N2 of the capacitors C1 and C2 are thereby connected to the bit-line pair /BL and BL.

In addition, at time t5, the voltage of the control signal lines V1 and V2 is pulled down from "H" by an amount of a certain overdrive voltage Vod (overdrive operation). The voltage of the nodes N1 and N2 thereby becomes −Vod by capacitance coupling. Because these nodes N1 and N2 are connected to the bit-line pair /BL and BL, the voltage of the bit-line pair /BL and BL is pulled down as shown by "c" and "d". The voltage applied to the ferroelectric capacitor in the selected memory cell by this overdrive operation being carried out is increased in comparison with before (a difference between voltage "c" and "d" is greater than a difference between "a" and "b"), and an accumulated residual polarization can thus be read effectively. Then, at time t6, the signal Vs2 is set to "L", thereby isolating the voltage generating circuit 4 and the bit-line pair /BL and BL, and, when an activation signal SAE for activating the sense amplifier circuit 2 is raised from "L" to "H", the voltage of the bit-line pair /BL and BL changes to either of "H" or "L".

Figure 9:
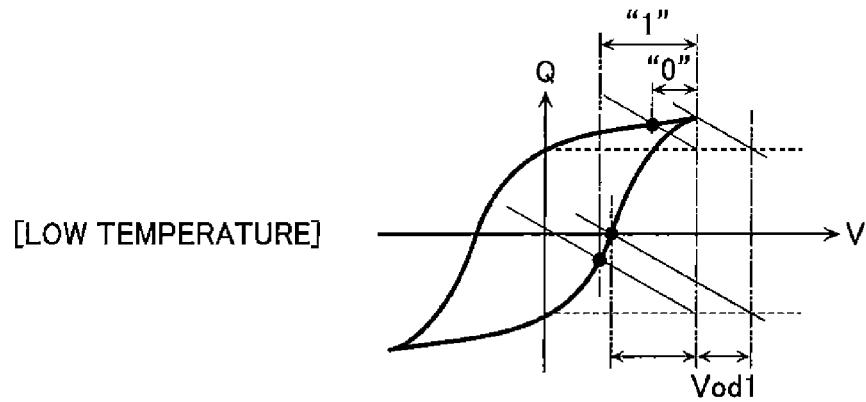
FIG. 9 is a graph explaining an optimum value of an overdrive voltage Vod.
Figure 10:
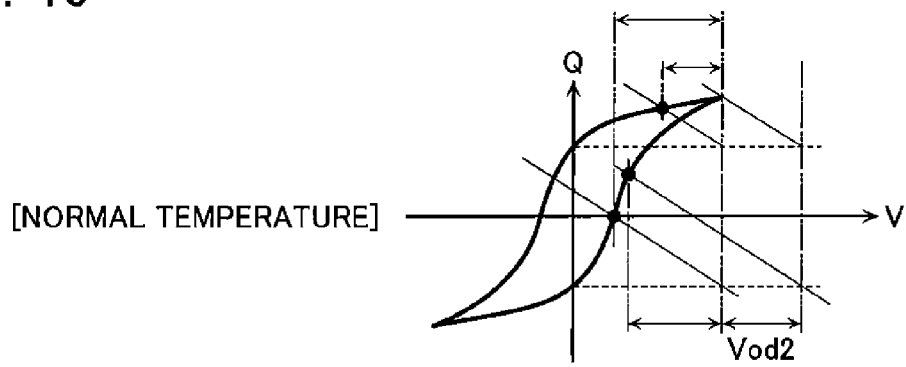
FIG. 10 is a graph explaining an optimum value of an overdrive voltage Vod.
Figure 11:
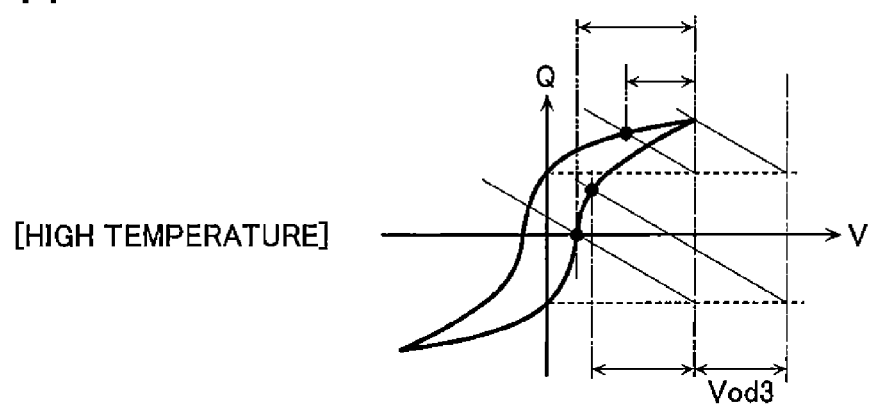
FIG. 11 is a graph explaining an optimum value of an overdrive voltage Vod.

As shown in FIGS. 9-11, the magnitude of the overdrive voltage Vod is given a temperature characteristic by the voltage generating circuit 4. That is, because an optimum value of the overdrive voltage Vod changes with temperature, the voltage generating circuit 4 is configured to set the overdrive voltage to the optimum value matched to the temperature.

Figure 12:
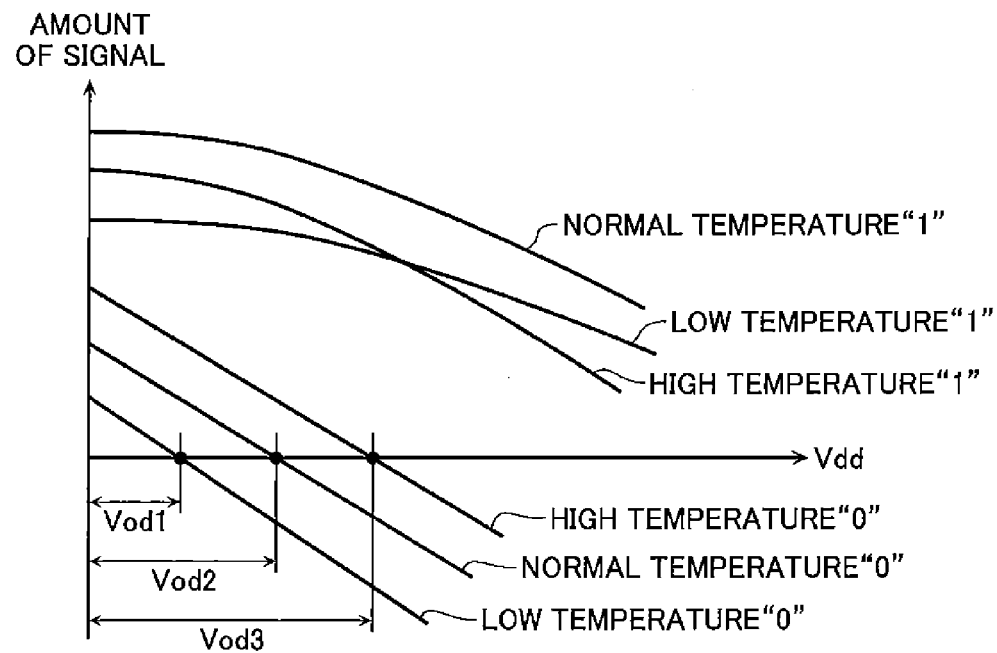
FIG. 12 is a graph explaining an optimum value of an overdrive voltage Vod.
Figure 13:
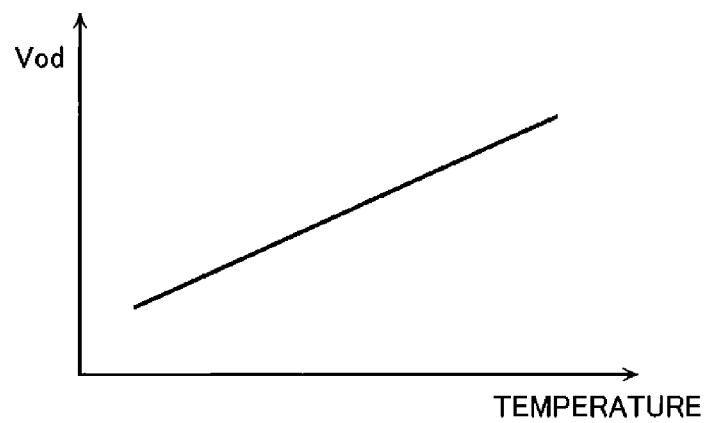
FIG. 13 is a graph explaining an optimum value of an overdrive voltage Vod.

Application of the overdrive voltage Vod causes the amount of signal of both a "0" cell and a "1" cell to decrease. As shown in FIG. 12, the voltage applied to the ferroelectric capacitor of memory cells becomes greatest when an amount of read signal from "0" cells becomes 0 V, and, thus, a value of the overdrive voltage Vod in this case becomes the optimum value. Note that, when the amount of read signal from "0" cells becomes a negative value, there is a risk that an unanticipated reverse current flows in the memory cell causing damage to the circuit. Thus, the overdrive voltage Vod should be set to the greatest value such that the amount of read signal from "0" cells becomes 0V, but does not become a negative value. That is, the overdrive voltage Vod should be set such that the bit line of the bit line pair showing a lower voltage becomes 0 V. Thus, as shown in FIG. 13, the overdrive voltage Vod is given a temperature characteristic such that it increases with rising temperature.

Figure 14:
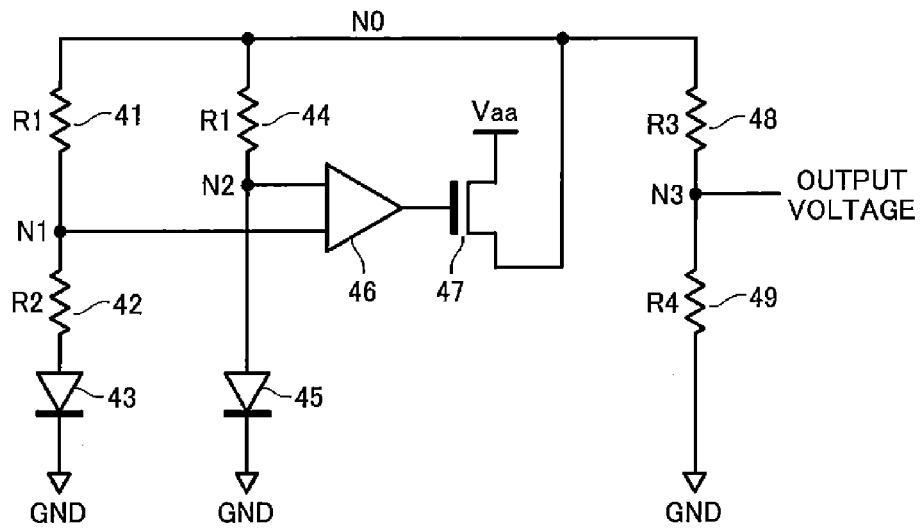
FIG. 14 is a circuit diagram showing a specific configuration example of a voltage generating circuit 4.

A specific configuration example of the voltage generating circuit 4 is shown in FIG. 14. This voltage generating circuit 4 has the following current paths. The first current path comprises resistors 41 (resistance R1) and 42 (resistance R2) and a diode 43 connected in series between a node N0 and a ground terminal GND. The second current path comprises a resistor 44 (resistance R1) and a diode 45 connected in series between the node N0 and the ground terminal GND. The third current path comprises resistors 48 (resistance R3) and 49 (resistance R4) connected in series between the node N0 and the ground terminal GND. Note that a connection node N3 of the resistors 48 and 49 is treated as an output terminal of an output voltage.

Figure 15:
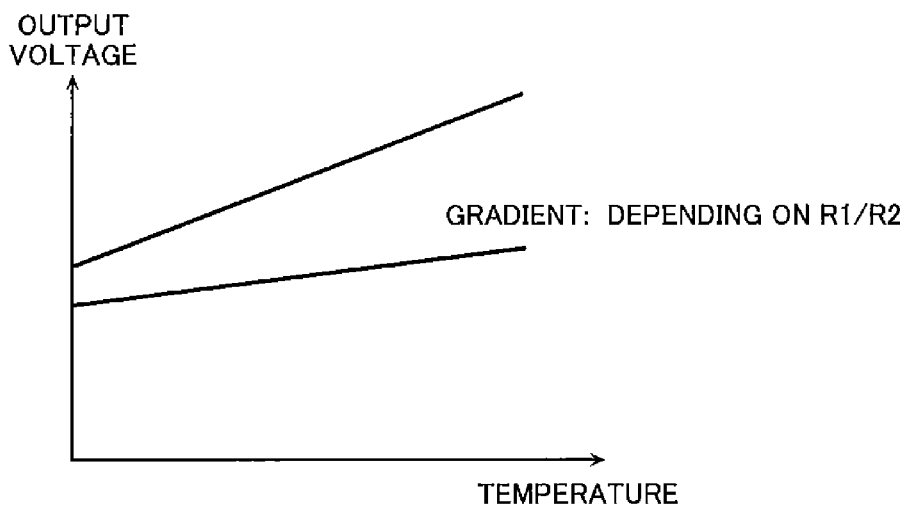
FIG. 15 is a graph showing output voltage characteristics of the voltage generating circuit 4 shown in FIG. 14.

A connection node N1 of the resistors 41 and 42 of the first current path and a connection node N2 of the resistor 44 and the diode 45 of the second current path are connected to input terminals of a differential amplification circuit 46. An output terminal of the differential amplification circuit 46 is connected to a gate of an NMOS transistor 47. The NMOS transistor 47 has a drain supplied with the voltage Vaa and a source connected to the node N0. In such a voltage generating circuit, a temperature characteristic of the output voltage as shown in FIG. 15 can be obtained by adjusting the resistances R1-R4 of the resistors 41, 42, 44, 48, and 49. A gradient of the output voltage characteristic depends on the ratio of the resistances R1 and R2.

Second Embodiment

Figure 16:
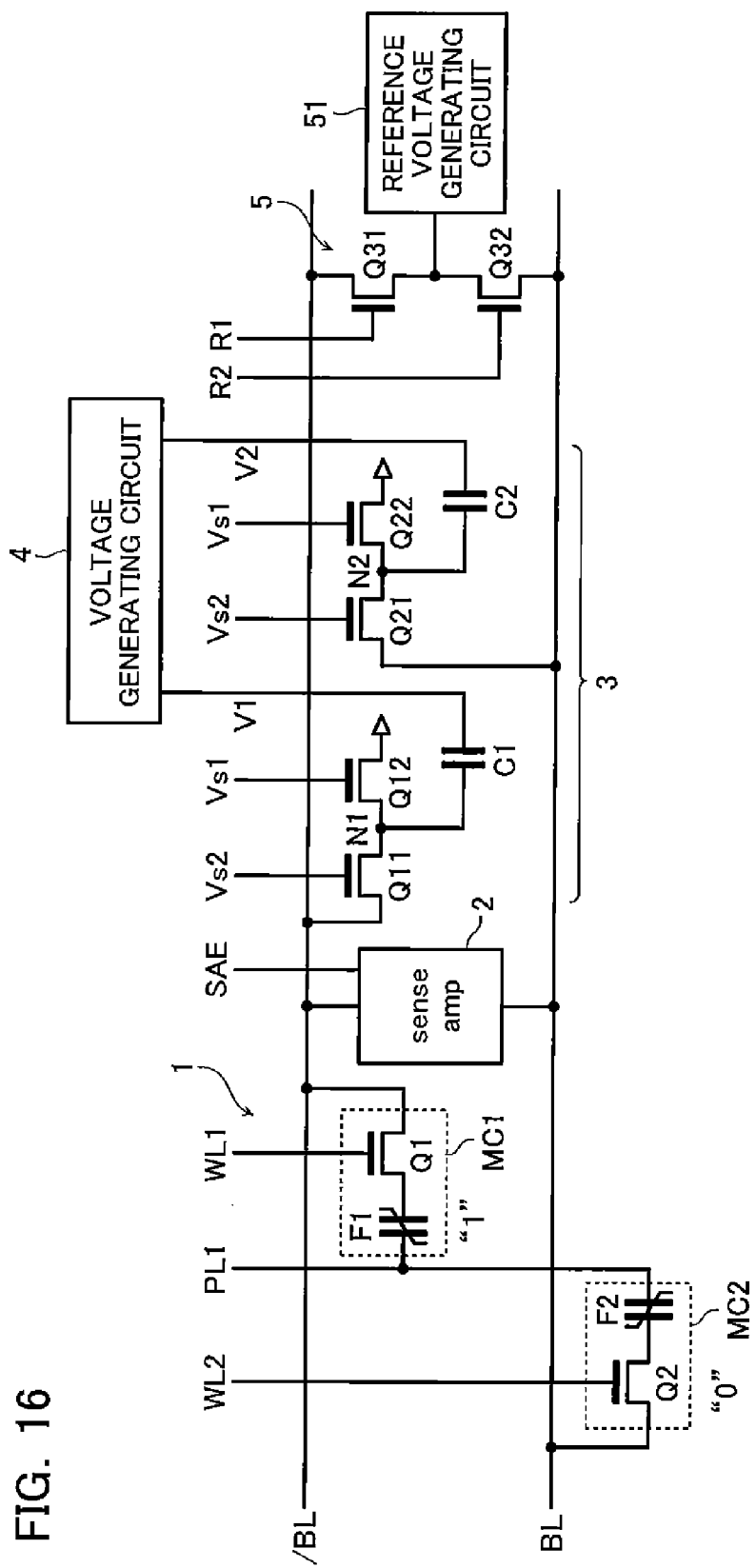
FIG. 16 shows a circuit configuration of a ferroelectric memory in accordance with a second embodiment of the present invention.

Next, a ferroelectric memory in accordance with a second embodiment of the present invention is described. FIG. 16 shows a circuit configuration of the ferroelectric memory in accordance with the second embodiment of the present invention. Note that in the second embodiment, identical symbols are assigned to elements similar to those in the ferroelectric memory of the first embodiment (FIG. 7) and a detailed description thereof is hereafter omitted.

A memory cell array 1 of this embodiment employs the 1T/1C structure. One data is stored in one memory cell MC connected to bit lines BL and /BL comprising a bit-line pair. The memory cell array 1 is provided with a reference voltage supply circuit 5 for supplying a complementary bit line with a reference voltage for comparison with a signal read from the memory cell MC. The reference voltage supply circuit 5 comprises NMOS transistors Q31 and Q32 connected in series between the bit-line pair BL and /BL, and, in addition, comprises a reference voltage generating circuit 51 providing the reference voltage to a connection node of the NMOS transistors Q31 and Q32. Selectively switching signals R1 and R2 to "H" allows the NMOS transistors Q31 and Q32 to be turned on alternately, and the reference voltage is thereby supplied to the bit line to which the signal charge of the memory cell is read and to the twin complementary bit lines.

Figure 17:
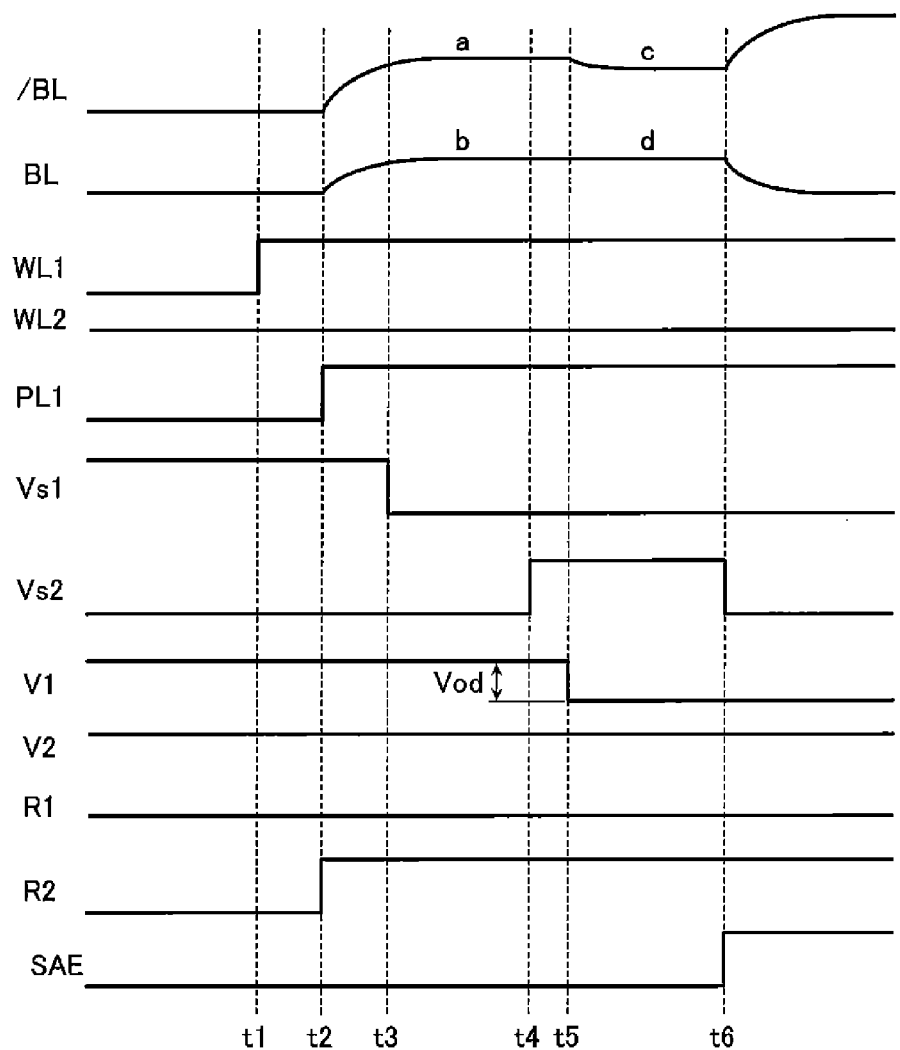
FIG. 17 shows an operation wave pattern of the ferroelectric memory in the second embodiment.

FIG. 17 shows an operation wave pattern of the ferroelectric memory in this embodiment. This operation wave pattern shows the case where a word line WL1 and a plate line PL1 connected to a memory cell MC1 are selected to execute a data read and re-write.

During standby, the bit-line pair /BL and BL, the word lines WL1 and WL2, and the plate line PL1 are all set to the ground potential Vss.

In addition, voltages of control signal lines V1 and V2 are both set to "H" (=Vaa). Moreover, a voltage of a control signal line Vs1 is set to "H", and a voltage of a control signal line Vs2 is set to "L" (=Vss). Capacitors C1 and C2 are thereby charged with a charge of Vaa·C.

Next, at time t1, the word line WL1 connected to the memory cell MC1 to be selected is set to "H" and then, at time t2, the plate line PL1 is set to "H" and, in addition, the signal R2 is set to "H". A voltage "a" depending on the stored data of the memory cell MC1 thereby appears in the bit line /BL. At the same time, a voltage "b" supplied from the reference voltage supply circuit 5 appears in the bit line BL.

Subsequently, at time t3, the voltage of the control signal line Vs1 is lowered from "H" to "L", and, following this, at time t4, the voltage of the control signal line Vs2 is raised from "L" to "H". Nodes N1 and N2 of the capacitors C1 and C2 are thereby connected to the bit-line pair /BL and BL.

In addition, at time t5, the voltage of the control signal line V1 is pulled down from "H" by an amount of a certain overdrive voltage Vod (overdrive operation). Note that since the overdrive operation is not required in the bit line BL applied with the reference voltage, the control signal line V2 is held at "H". The voltage of the node N1 thereby becomes −Vod. Because this node N1 is connected to the bit line /BL of the bit-line pair, the voltage of the bit line /BL of the bit-line pair is pulled down as shown by c. That is, an overdrive operation similar to that of the first embodiment is executed and an accumulated residual polarization in the ferroelectric capacitor of memory cells can be read effectively.

Then, at time t6, the signal Vs2 is set to "L", thereby isolating the voltage generating circuit 4 and the bit-line pair /BL and BL, and, when an activation signal SAE for activating the sense amplifier circuit 2 is raised from "L" to "H", the voltage of the bit-line pair /BL and BL changes to either of "H" or "L".

Third Embodiment

Figure 18:
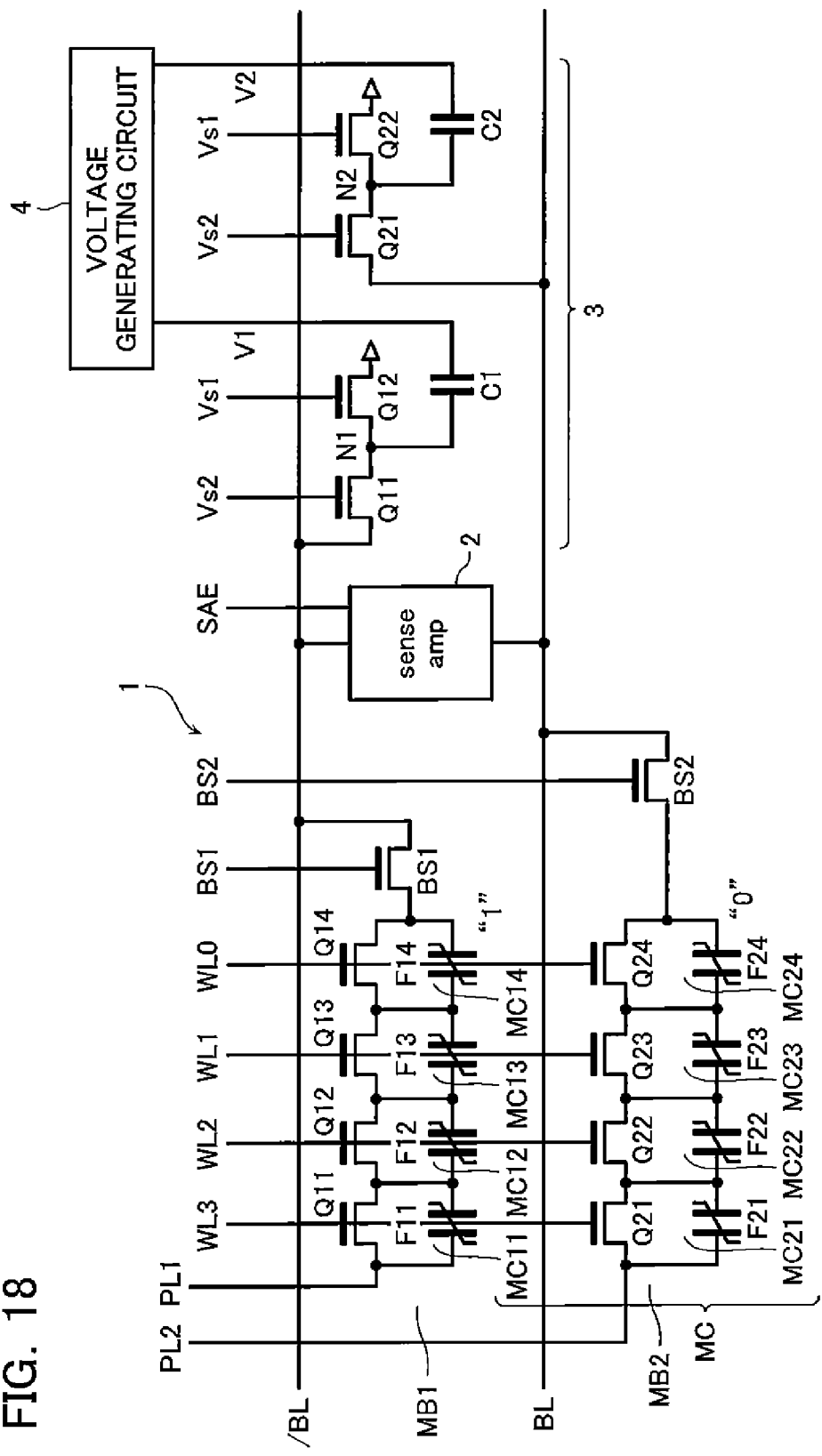
FIG. 18 shows a circuit configuration of a ferroelectric memory in accordance with a third embodiment of the present invention.

Next, a ferroelectric memory in accordance with a third embodiment of the present invention is described. FIG. 18 shows a circuit configuration of the ferroelectric memory in accordance with the third embodiment of the present invention. Note that in the third embodiment, identical symbols are assigned to elements similar to those in the ferroelectric memory of the first and second embodiments (FIGS. 7 and 16) and a detailed description thereof is hereafter omitted. The ferroelectric memory of this embodiment is directed to a so-called TC parallel unit series-connected ferroelectric memory configured as an arrangement of memory cell blocks MB each formed of a plurality of memory cells MC connected in series, each memory cell MC constituted by a ferroelectric capacitor F and a transistor Q connected in parallel. Moreover, this TC parallel unit series-connected ferroelectric memory adopts the 2T/2C scheme.

In this embodiment, memory cell blocks MB1 and MB2 share word lines WL0-WL3, and complementary data are stored in memory cells MC connected to the same word line WL (for example, "0" is stored in a memory cell MC24 when "1" is stored in a memory cell MC14); the 2T/2C scheme is adopted.

Plate lines PL1 and PL2 for applying the plate line voltage are respectively connected to memory cells MC11 and MC21 lying at one end of the memory cell blocks MB1 and MB2.

Moreover, the other end of the memory cell blocks MB1 and MB2 is connected to the bit-line pair /BL and BL via block select transistors BS1 and BS2, respectively. The block select transistors BS1 and BS2 are on/off controlled by block select signals BS1 and BS2.

In these memory cell blocks MB1 and MB2, all word lines WLi (i=0-3) are set to "H" during standby, and all ferroelectric capacitors Fi are thereby prevented from being applied with a voltage. However, when, for example, a word line WL0 only is set to "L" for a data read, a voltage is applied across the ferroelectric capacitors F14 and F24, and a voltage based on the cell data stored in the ferroelectric capacitors F14 and F24 appears in the bit-line pair /BL and BL, thereby executing the data read.

Figure 19:
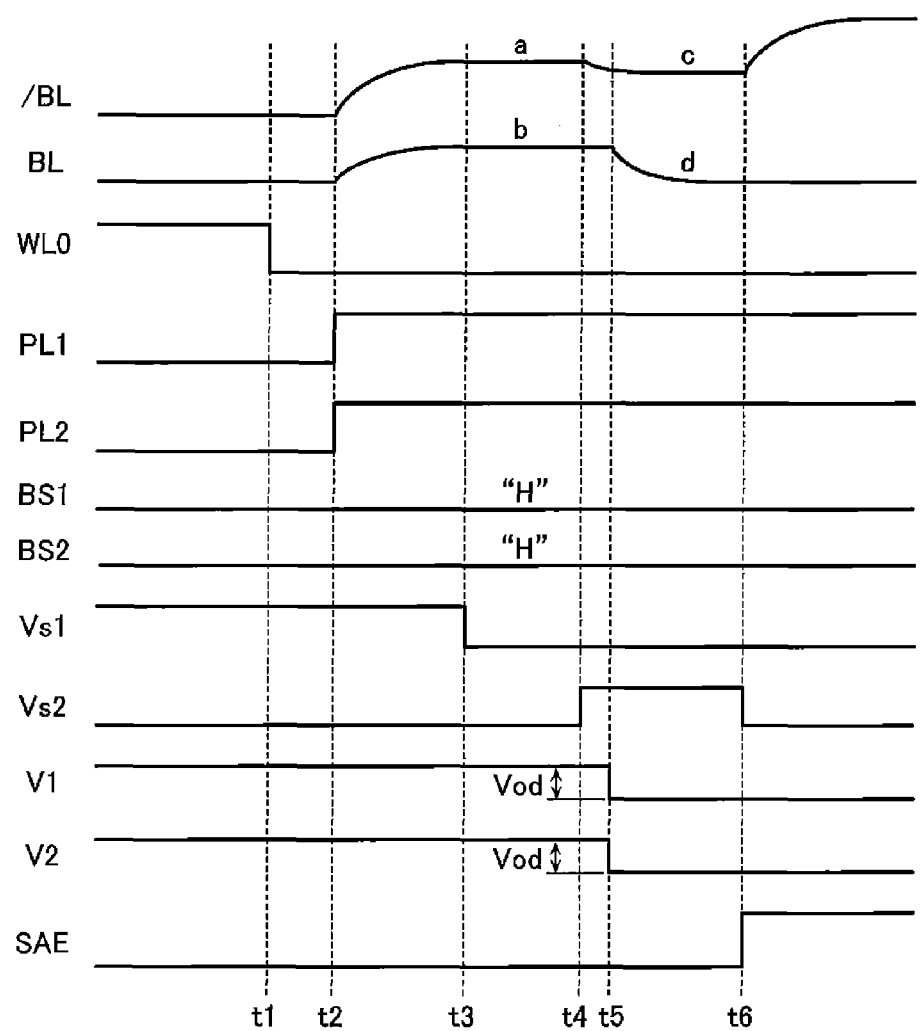
FIG. 19 shows an operation wave pattern of the ferroelectric memory in the third embodiment.

FIG. 19 shows an operation wave pattern of the ferroelectric memory in this embodiment. This operation wave pattern shows the case where the word line WL0 and the plate lines PL1 and PL2 connected to the memory cell MC14 and the memory cell MC24 are selected to execute a data read and re-write.

During standby, the bit-line pair /BL and BL, and the plate lines PL1 and PL2 are all set to the ground potential Vss. The word lines WL0-WL3 are all set to "H". In addition, the block select signals BS1 and BS2 are set to "H". Furthermore, voltages of control signal lines V1 and V2 are both set to "H" (=Vaa). Moreover, a voltage of a control signal line Vs1 is set to "H", and a voltage of a control signal line Vs2 is set to "L" (=Vss). A capacitor C1 is thereby charged with a charge of Vaa·C.

Then, at time t1, the word line WL0 only is switched from "H" to "L", the word line WL0 being the word line connected to the selected memory cells MC14 and MC24, and, following this, at time t2, the voltage of the plate lines PL1 and PL2 is switched to "H". A voltage is thereby applied across the ferroelectric capacitors F14 and F24. Subsequent operation is substantially similar to that of the first embodiment and a description thereof is omitted.

Fourth Embodiment

Figure 20:
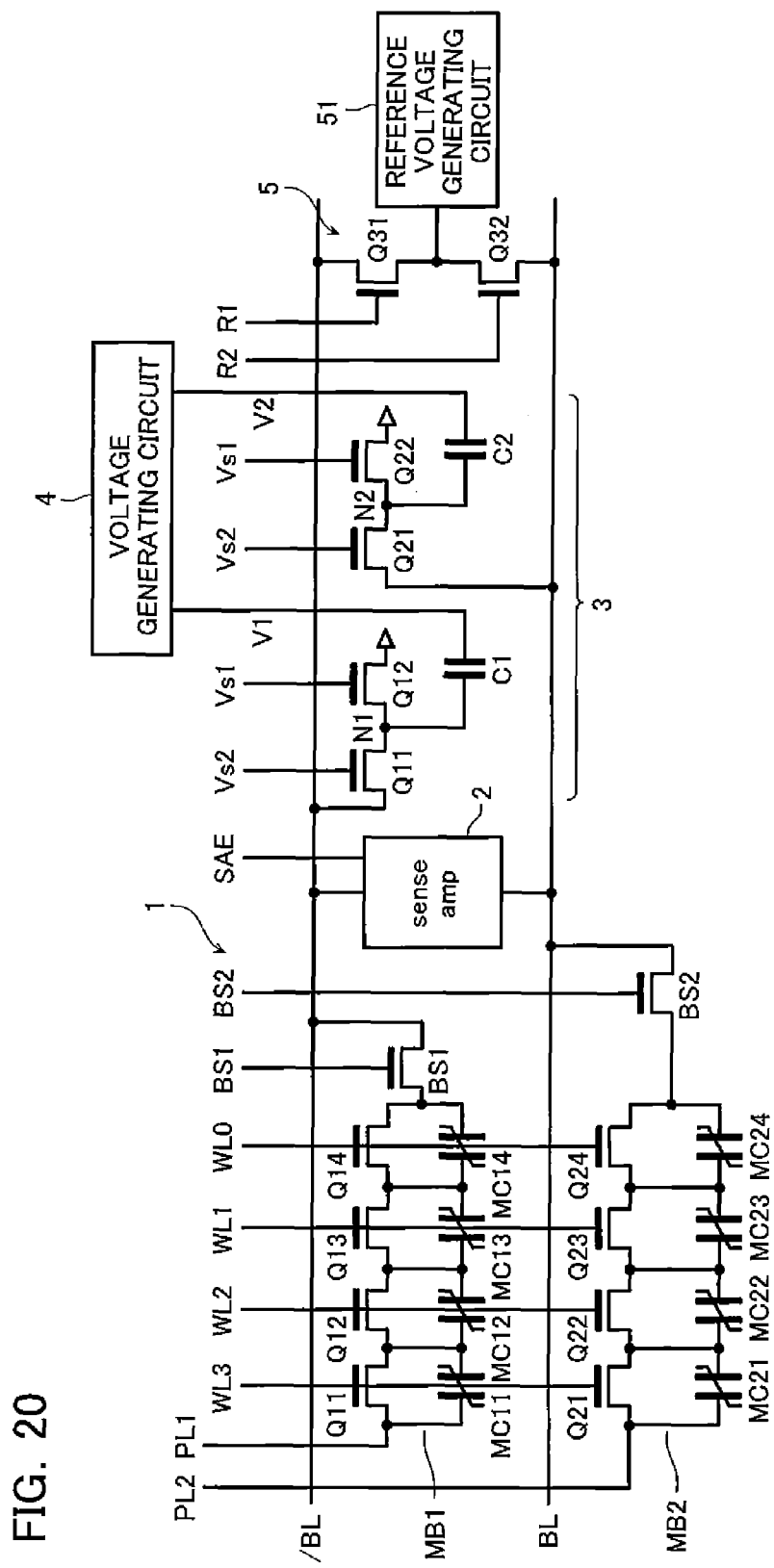
FIG. 20 shows a circuit configuration of a ferroelectric memory in accordance with a fourth embodiment of the present invention.

Next, a ferroelectric memory in accordance with a fourth embodiment of the present invention is described. FIG. 20 shows a circuit configuration of the ferroelectric memory in accordance with the fourth embodiment of the present invention. Note that in the fourth embodiment, identical symbols are assigned to elements similar to those in the ferroelectric memory of the aforementioned embodiments and a detailed description thereof is hereafter omitted.

The ferroelectric memory of this embodiment is similar to the third embodiment in that it is directed to the so-called TC parallel unit series-connected type ferroelectric memory. But it differs from the third embodiment in adopting the 1T/1C scheme. That is, in memory blocks MB1 and MB2, either one of memory cells MC is selected by block transistors BS1 and BS2 being turned on selectively, and the signal is thereby read to a bit line of the bit-line pair /BL and BL. Moreover, a reference voltage supply circuit 5 similar to that of the second embodiment is provided to execute the 1T/1C scheme.

Figure 21:
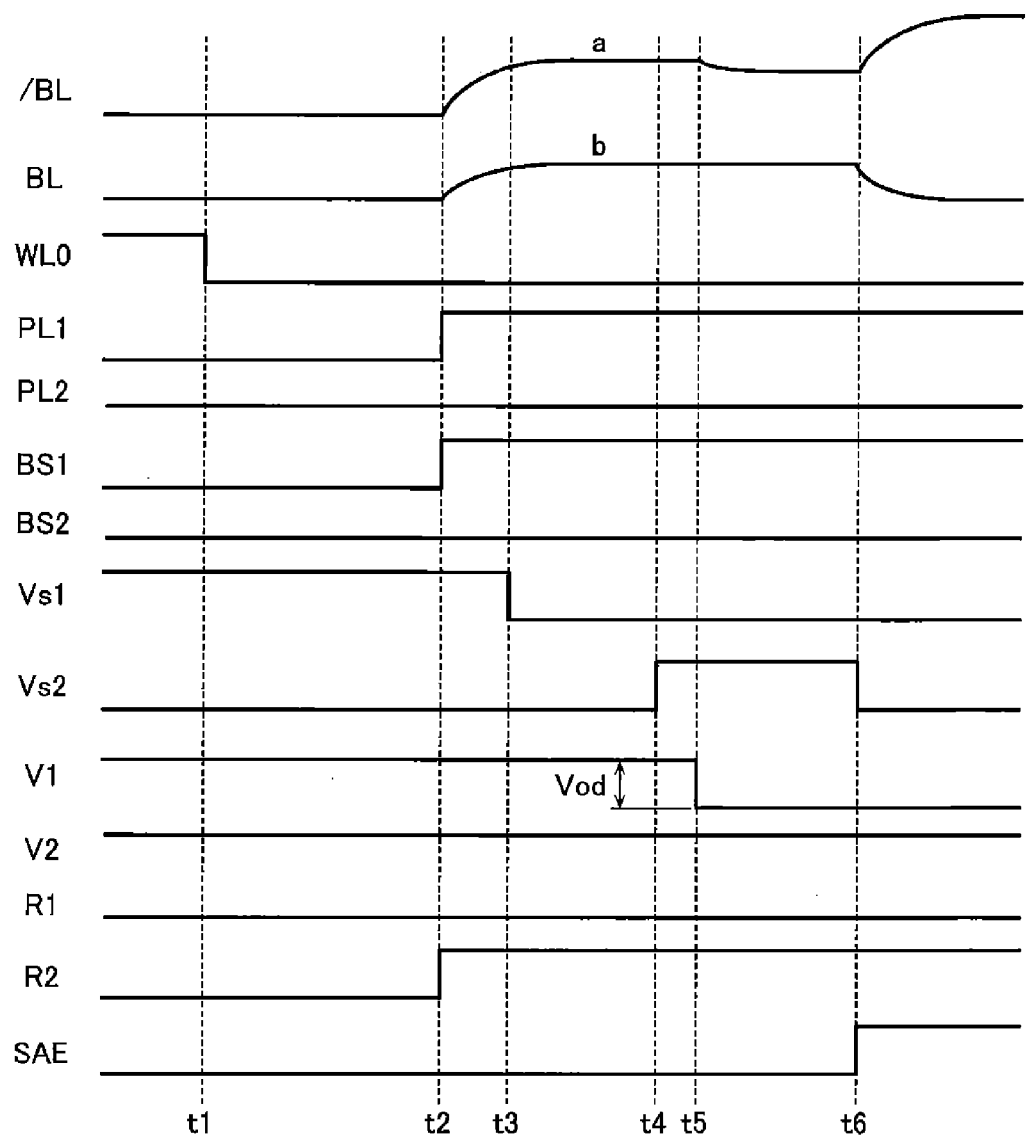
FIG. 21 shows an operation wave pattern of the ferroelectric memory in the fourth embodiment.

FIG. 21 shows an operation wave pattern of the ferroelectric memory in this fourth embodiment.

This operation wave pattern shows the case where a word line WL0 and a plate line PL1 connected to a memory cell MC14 in the memory cell block MB1 are selected to execute a data read and re-write.

During standby, the bit-line pair /BL and BL, and the plate lines PL1 and PL2 are all set to the ground potential Vss. The word lines WL0-WL3 are all set to "H". In addition, block select signals BS1 and BS2 are set to "L". Furthermore, voltages of control signal lines V1 and V2 are both set to "H" (=Vaa). Moreover, a voltage of a control signal line Vs1 is set to "H", and a voltage of a control signal line Vs2 is set to "L" (=Vss). A capacitor C1 is thereby charged with a charge of Vaa·C.

Then, at time t1, the word line WL0 only is switched from "H" to "L", the word line WL0 being the word line connected to the selected memory cell MC14, and, following this, at time t2, the voltage of the plate line PL1 is switched to "H". A voltage is thereby applied to the ferroelectric capacitor F14. Subsequent operation is substantially similar to that of the second embodiment and a description thereof is omitted.

Fifth Embodiment

Figure 22:
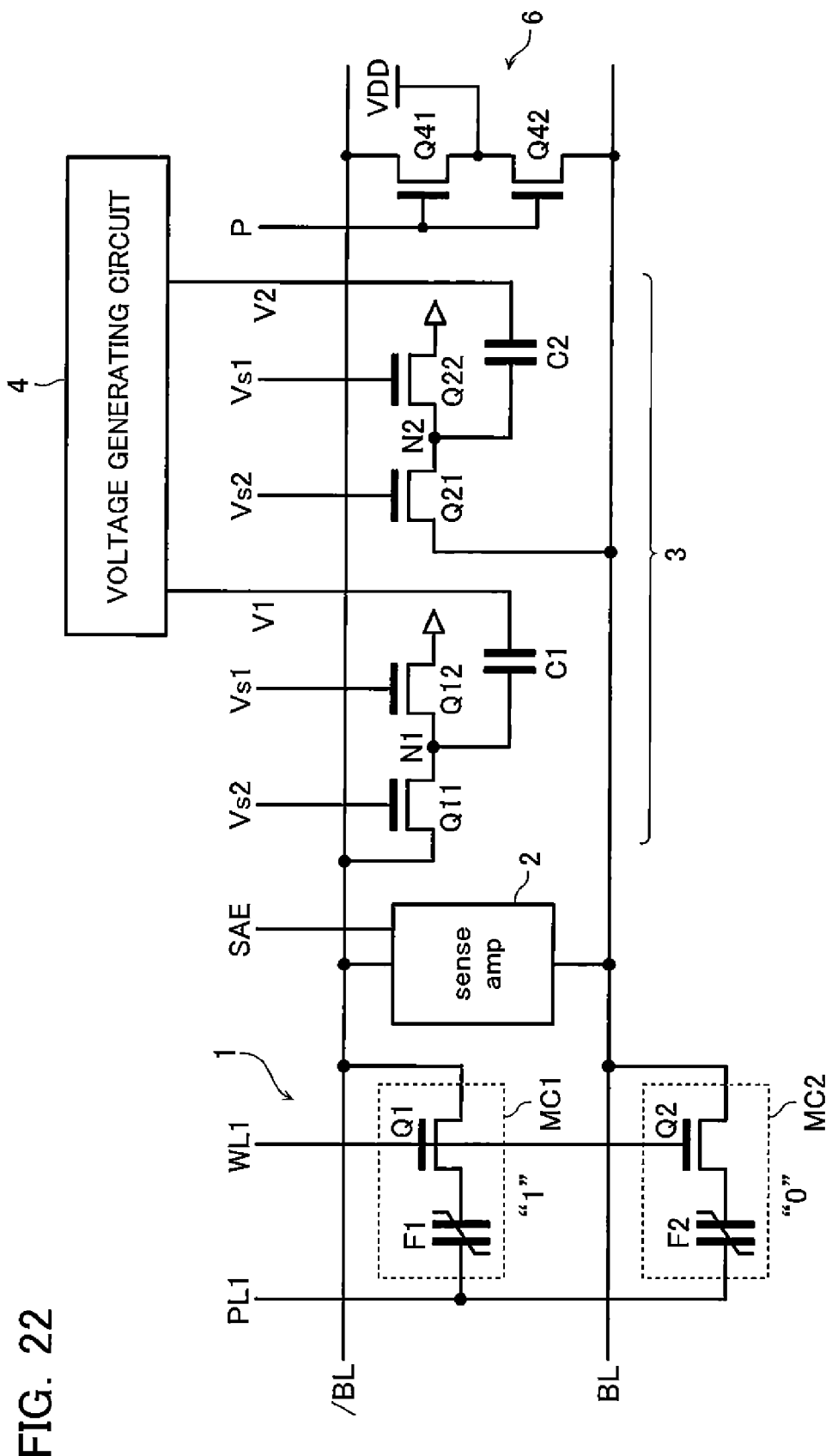
FIG. 22 shows a circuit configuration of a ferroelectric memory in accordance with a fifth embodiment of the present invention.

Next, a ferroelectric memory in accordance with a fifth embodiment of the present invention is described. FIG. 22 shows a circuit configuration of the ferroelectric memory in accordance with the fifth embodiment of the present invention. Note that in the fifth embodiment, identical symbols are assigned to elements similar to those in the ferroelectric memory of the aforementioned embodiments and a detailed description thereof is hereafter omitted.

The ferroelectric memory of this embodiment has a DRAM-like structure and adopts the 2T/2C scheme, similarly to the first embodiment. However, a direction of the voltage applied to a selected memory cell MC during a read operation in this embodiment differs from that of the aforementioned embodiments.

That is, prior to execution of the read operation, the bit-line pair /BL and BL are pre-charged to voltage Vaa by a pre-charge circuit 6, while the potential of a plate line PL is constantly fixed at 0 V. The pre-charge circuit 6 comprises NMOS transistors Q41 and Q42 connected in series between the bit-line pair /BL and BL, and has a power source voltage Vaa applied to a connection node thereof. In addition, a signal P is commonly inputted to a gate of both the transistors Q41 and Q42.

This embodiment further differs from the previous embodiments in that an overdrive voltage Vod applied by an overdrive operation is a positive value, not a negative value. This is due to the fact that the direction of the voltage applied to the memory cell MC differs from that of the aforementioned embodiments, as previously mentioned.

Figure 23:
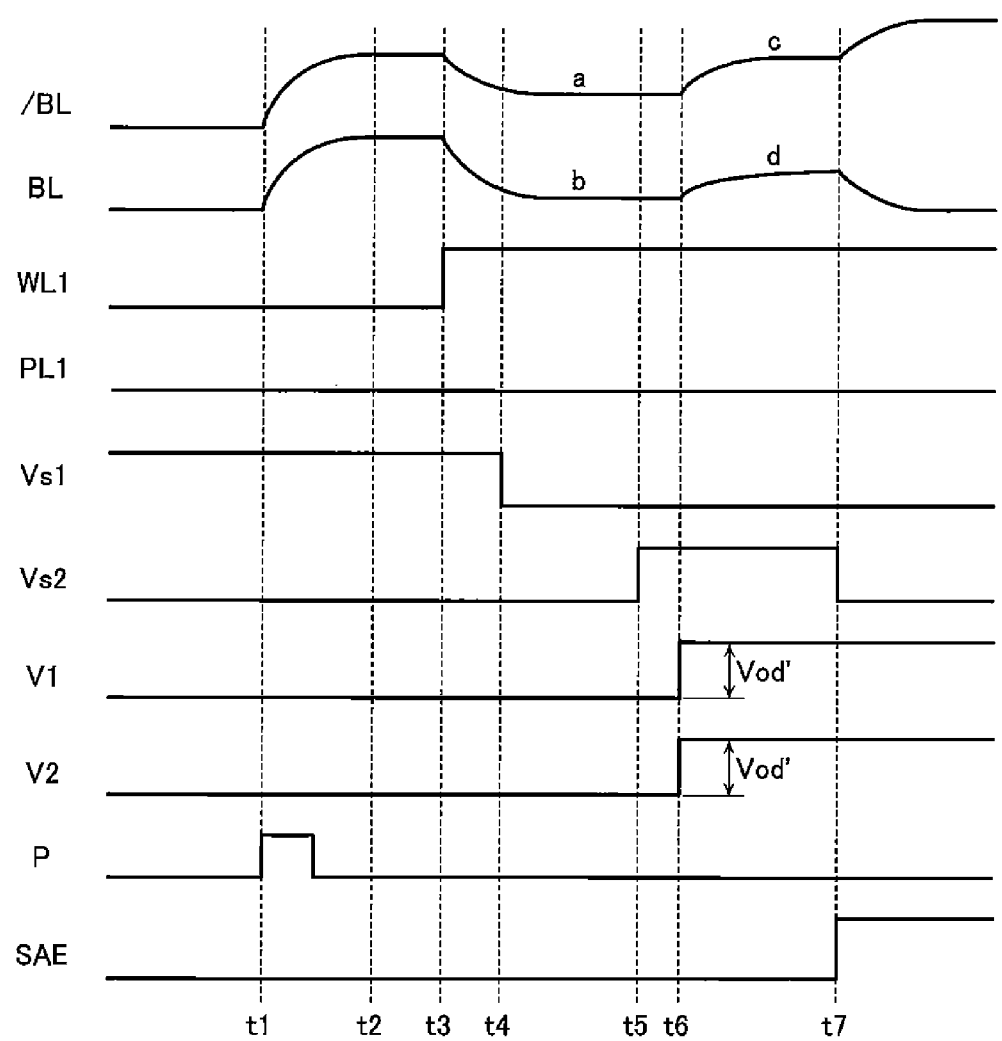
FIG. 23 shows an operation wave pattern of the ferroelectric memory in the fifth embodiment.

FIG. 23 shows an operation wave pattern of the ferroelectric memory in this embodiment.

This operation wave pattern is for the case where a word line WL1 and a plate line PL1 connected to a memory cell MC1 and a memory cell MC2 are selected to execute a data read and re-write.

During standby, the bit-line pair /BL and BL, and the word line WL1 are all set to the ground potential Vss. As previously mentioned, the potential of the plate line PL1 is constantly fixed at the ground potential Vss.

In addition, voltages of control signal lines V1 and V2 are both set to "L" (=Vss). Moreover, a voltage of a control signal line Vs1 is set to "H", and a voltage of a control signal line Vs2 is set to "L" (=Vss). A charge in capacitors C1 and C2 is thereby discharged.

Next, at time t1, the signal P of the pre-charge circuit 6 is raised to "H" for a certain period of time, whereby the bit-line pair /BL and BL are charged to Vaa. Subsequently, at time t3, the word line WL1 is set to "H". The voltage (a, b) depending on the stored data of the memory cells MC1 and MC2 thereby appears in the bit-line pair /BL and BL.

Then, at time t4, the voltage of the control signal line Vs1 is lowered from "H" to "L", and, following this, at time t5, the voltage of the control signal line Vs2 is raised from "L" to "H". Nodes N1 and N2 of the capacitors C1 and C2 are thereby connected to the bit-line pair /BL and BL.

In addition, at time t6, the voltage of the control signal lines V1 and V2 is increased from "L" by an amount of a certain overdrive voltage Vod (overdrive operation). The voltage of the nodes N1 and N2 thereby becomes +Vod. Because these nodes N1 and N2 are connected to the bit-line pair /BL and BL, the voltage of the bit-line pair /BL and BL is pulled up as shown by "c" and "d". Thus, the voltage applied to the ferroelectric capacitor can be increased, and an accumulated residual polarization can be read effectively, similarly to the aforementioned embodiments.

Then, at time t7, the signal Vs2 is set to "L", thereby isolating the voltage generating circuit 4 and the bit-line pair /BL and BL, and, when an activation signal SAE for activating the sense amplifier circuit 2 is raised from "L" to "H", the voltage of the bit-line pair /BL and BL changes to either of "H" or "L".

Sixth Embodiment

Figure 24:
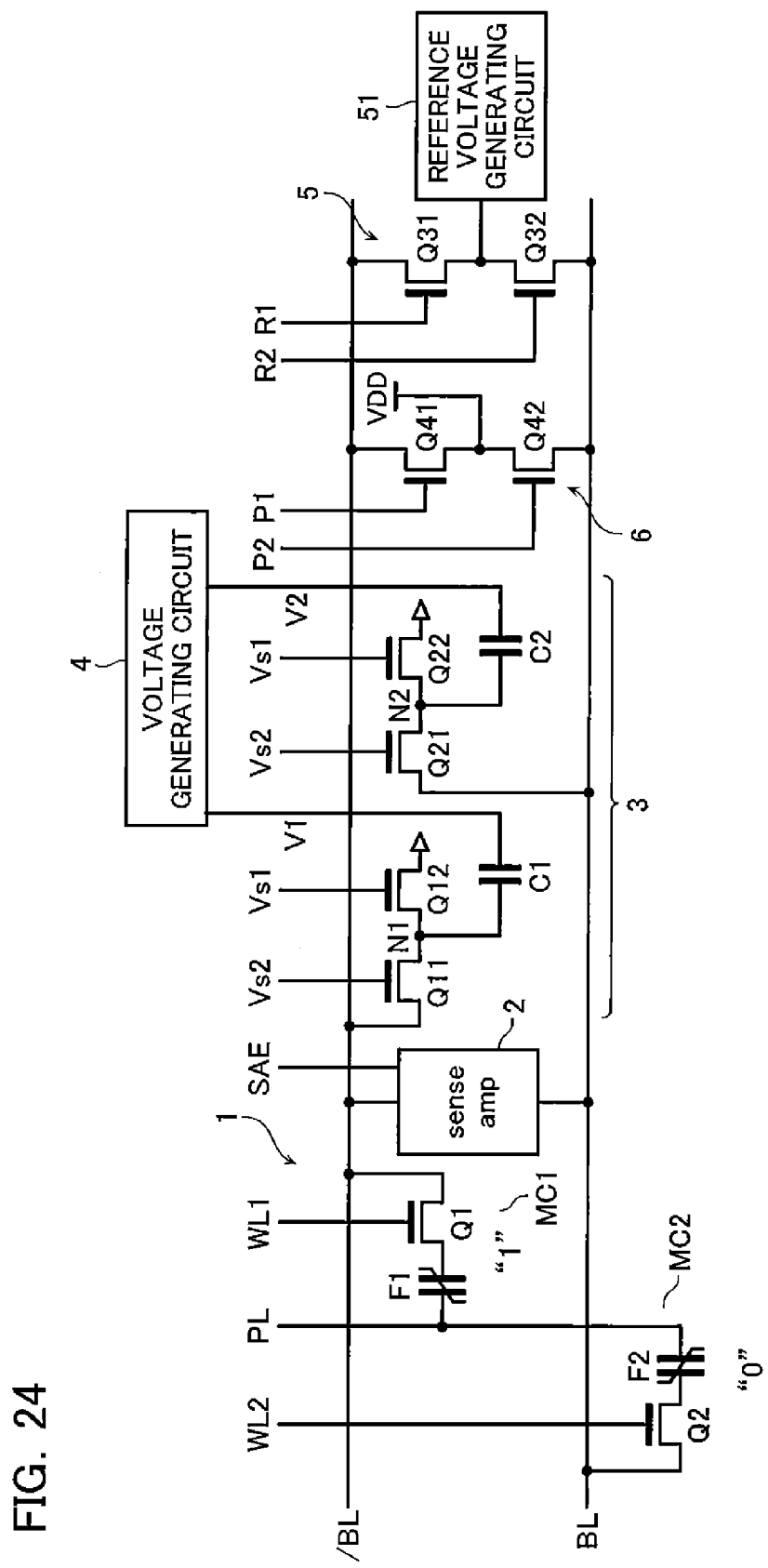
FIG. 24 shows a circuit configuration of a ferroelectric memory in accordance with a sixth embodiment of the present invention.

Next, a ferroelectric memory in accordance with a sixth embodiment of the present invention is described. FIG. 24 shows a circuit configuration of the ferroelectric memory in accordance with the sixth embodiment of the present invention. Note that in the sixth embodiment, identical symbols are assigned to elements similar to those in the ferroelectric memory of the aforementioned embodiments and a detailed description thereof is hereafter omitted.

The ferroelectric memory of this embodiment has a DRAM-like structure, similarly to the fifth embodiment, but adopts the 1T/1C system. The ferroelectric memory of this embodiment is therefore provided with a reference voltage supply circuit 5, as shown in FIG. 24. Also similarly to the fifth embodiment, a direction of the voltage applied to a selected memory cell MC during a read operation differs from that of the first embodiment, the bit-line pair /BL and BL side being applied with a positive voltage, and a plate line PL1 being constantly fixed at the ground potential Vss (0 V).

Figure 25:
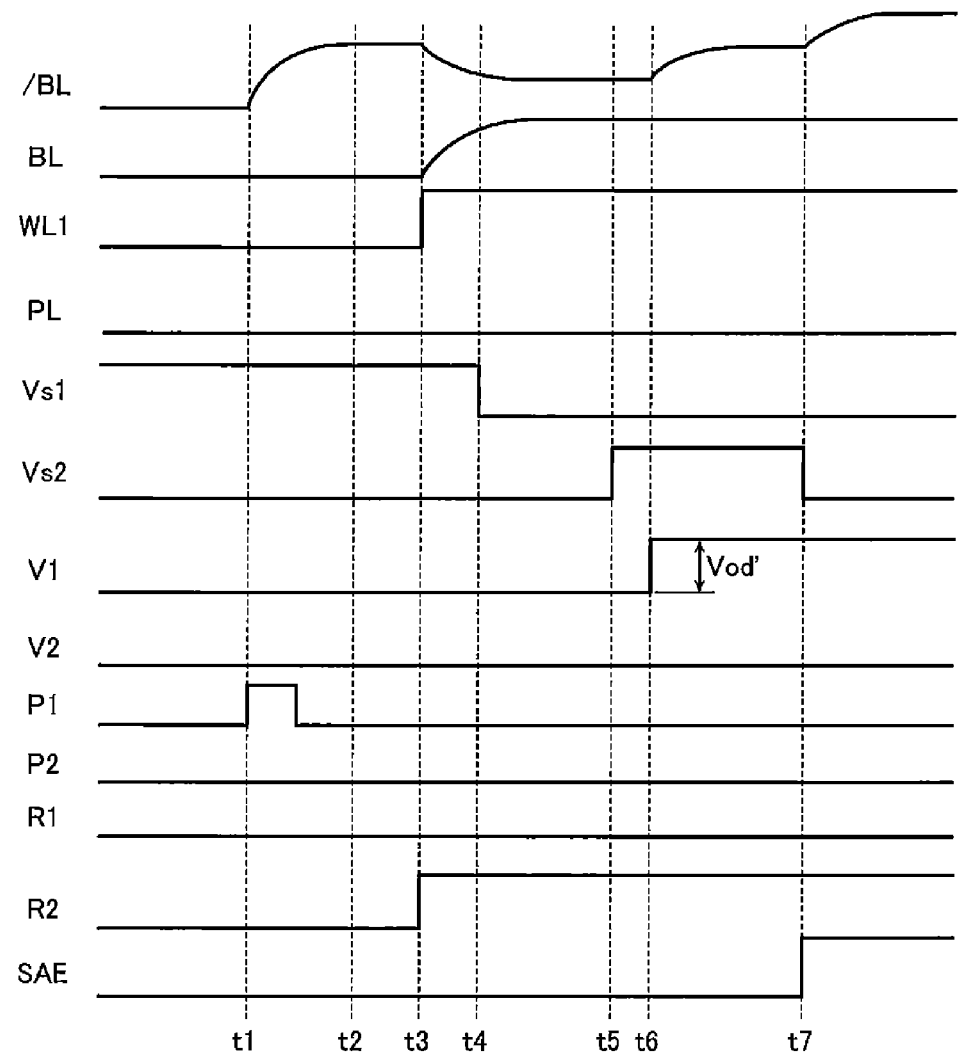
FIG. 25 shows an operation wave pattern of the ferroelectric memory in the sixth embodiment.

FIG. 25 shows an operation wave pattern of the ferroelectric memory in this embodiment. This operation wave pattern is for the case where a word line WL1 and a plate line PL connected to a memory cell MC1 are selected to execute a data read and re-write.

During standby, the bit-line pair /BL and BL, and the word line WL1 are all set to the ground potential Vss. The potential of a plate line PL1 is constantly fixed at the ground potential Vss.

In addition, voltages of control signal lines V1 and V2 are both set to "L" (=Vss). Moreover, a voltage of a control signal line Vs1 is set to "H", and a voltage of a control signal line Vs2 is set to "L" (=Vss). A charge in capacitors C1 is thereby discharged.

Next, at time t1, a signal P1 of a pre-charge circuit 6 is raised to "H" for a certain period of time, whereby the bit line /BL is charged to Vaa. The bit line BL is left "L", since it is later charged by the reference voltage supply circuit 5 and therefore does not require charging at this time.

Subsequently, at time t3, the word line WL1 is set to "H", and, in addition, a signal R2 is set from "L" to "H". Thereby, a voltage depending on the stored data of the memory cell MC1 appears in the bit line /BL, and a reference voltage appears in the bit line BL.

Then, at time t4, the voltage of the control signal line Vs1 is lowered from "H" to "L", and, following this, at time t5, the voltage of the control signal line Vs2 is raised from "L" to "H". A node N1 of a capacitor C1 is thereby connected to the bit-line pair /BL and BL.

In addition, at time t6, the voltage of the control signal line V1 is increased from "L" by an amount of a certain overdrive voltage Vod (overdrive operation). The voltage of the node N1 thereby becomes +Vod. Because this node N1 is connected to the bit line /BL, the voltage of the bit line /BL is increased. Thus, the voltage applied to the ferroelectric capacitor can be increased, and an accumulated residual polarization can be read effectively, similarly to the aforementioned embodiments.

Then, at time t7, the signal Vs2 is set to "L", thereby isolating the voltage generating circuit 4 and the bit-line pair /BL and BL, and, when an activation signal SAE for activating the sense amplifier circuit 2 is raised from "L" to "H", the voltage of the bit-line pair /BL and BL changes to either of "H" or "L".

This concludes description of embodiments of the semiconductor memory device in accordance with the present invention, but it should be noted that the present invention is not limited to the above-described embodiments, and that various alterations, additions, and so on, are possible within a range not departing from the scope and spirit of the invention.

What is claimed is:
1. A semiconductor memory device, comprising:
   a memory cell array comprising a memory cell comprising a ferroelectric capacitor and a transistor;

a word line configured to select the memory cell;

a plate line configured to apply a drive voltage to a first end of the ferroelectric capacitor;

a bit line configured to read data in the memory cell from a second end of the ferroelectric capacitor;

a sense amplifier circuit configured to detect a signal on the bit line and to amplify the signal; and a bit line voltage controller configured to provide an overdrive voltage to a bit line that is to be provided with a signal from a memory cell to be read after activation of a selected word line and prior to a data read operation of the sense amplifier circuit, wherein the bit line voltage controller is configured to vary the overdrive voltage depending on ambient temperature.

2. The semiconductor memory device of claim 1, wherein the bit line voltage controller comprises a capacitor configured to change the voltage of the bit line by capacitance coupling with the bit line.

3. The semiconductor memory device of claim 1, wherein a first memory cell is connected to a first bit line in a pair of the bit lines and configured to store a first data;

a second memory cell is connected to a second bit line in the pair of the bit lines and configured to store a second data comprising a complementary relation with the first data;

the first and second bit lines are configured to read out the first and second data simultaneously, and the bit line voltage controller is configured to vary the overdrive voltage such that either a voltage of the first bit line or the second bit line is set substantially to 0 V.

4. The semiconductor memory device of claim 3, wherein the bit line voltage controller comprises a capacitor configured to change the voltage of the bit line by capacitance coupling with the bit line.

5. The semiconductor memory device of claim 1, wherein the plate line is set at a first potential and the bit line is set at a second potential smaller than the first potential prior to reading the memory cell, and the bit line voltage controller is configured to pull down the voltage of the bit line.

6. The semiconductor memory device of claim 5, wherein the bit line voltage controller comprises a capacitor configured to change the voltage of the bit line by capacitance coupling with the bit line.

7. The semiconductor memory device of claim 6, wherein a first memory cell is connected to a first bit line in a pair of bit lines and configured to store a first data;

a second memory cell is connected to a second bit line in the pair of the bit lines and configured to store a second data comprising a complementary relation with the first data;

the first and second bit line are configured to read out the first and second data simultaneously, and the bit line voltage controller is configured to vary the overdrive voltage such that either a voltage of the first bit line or the second bit line is set substantially to 0 V.

8. The semiconductor memory device of claim 1, further comprising a reference voltage generator configured to supply a reference voltage to a second bit line in a pair of the bit lines, wherein the bit line voltage controller is configured to change the voltage of a first bit line in the pair of bit lines for reading the signal from the memory cell and to keep the voltage of the second bit line constant.

9. The semiconductor memory device of claim 8, wherein the bit line voltage controller comprises a capacitor configured to change the voltage of the bit line by capacitance coupling with the bit line.

10. The semiconductor memory device of claim 1, wherein the bit line is set at a first potential and the plate line is set at a second potential smaller than the first potential prior to reading the memory cell, and the bit line voltage controller is configured to pull up the voltage of the bit line.

11. The semiconductor memory device of claim 10, wherein a potential of the plate line is substantially constant at the second potential.

12. The semiconductor memory device of claim 11, wherein the second potential is substantially 0 V.

13. The semiconductor memory device of claim 10, wherein the bit line voltage controller comprises a capacitor configured to change the voltage of the bit line by capacitance coupling with the bit line.

14. The semiconductor memory device of claim 10, further comprising a reference voltage generator configured to supply a reference voltage to a second bit line in a pair of bit lines, wherein the bit line voltage controller is configured to change the voltage of a first bit line in the pair of the bit lines for reading the signal from the memory cell and to keep the voltage of the second bit line constant.

15. The semiconductor memory device of claim 1, wherein the bit line voltage controller comprises a capacitor comprising a first end with a temperature-dependent voltage with a predetermined temperature characteristic, and a first transistor connected between a second end of the capacitor and the bit line and configured to selectively turn on.

16. The semiconductor memory device of claim 15, wherein the bit line voltage controller further comprises a second transistor connected between the second end of the capacitor and a ground terminal and configured to selectively turn on.

17. The semiconductor memory device of claim 16, wherein the bit line voltage controller is configured to turn on the second transistor while charging the capacitor by applying the temperature-dependent voltage to the first end of the capacitor; and to turn off the second transistor and to turn on the first transistor.

* * * * *